United States Patent [19]
Nakamura

[11] Patent Number: 6,100,597
[45] Date of Patent: Aug. 8, 2000

[54] SEMICONDUCTOR DEVICE AND METHOD FOR MANUFACTURING THE SAME

[75] Inventor: Hirofumi Nakamura, Tokyo, Japan

[73] Assignee: NEC Corporation, Tokyo, Japan

[21] Appl. No.: 08/968,187

[22] Filed: Nov. 12, 1997

[30] Foreign Application Priority Data

Nov. 15, 1996 [JP] Japan .................................. 8-304262

[51] Int. Cl.[7] .............................. H01L 21/60; H06K 1/14
[52] U.S. Cl. ......................... 257/787; 257/737; 257/788; 257/783
[58] Field of Search ................................. 257/787, 737, 257/788, 783

[56] References Cited

U.S. PATENT DOCUMENTS

| | | |
|---|---|---|
| 4,326,238 | 4/1982 | Takeda et al. . |
| 5,241,133 | 8/1993 | Mullen, III et al. ..................... 257/787 |
| 5,508,561 | 4/1996 | Tago et al. ............................. 257/737 |
| 5,543,585 | 8/1996 | Booth et al. ............................ 361/768 |
| 5,633,204 | 5/1997 | Tago et al. ............................. 438/614 |
| 5,872,400 | 2/1999 | Chapman et al. ....................... 257/737 |

FOREIGN PATENT DOCUMENTS

| | | |
|---|---|---|
| 58-95405 | 6/1983 | Japan . |
| 3-270502 | 12/1991 | Japan . |
| 4-133501 | 5/1992 | Japan . |
| 4-126407 | 11/1992 | Japan . |
| 5-6919 | 1/1993 | Japan . |
| 5-136146 | 6/1993 | Japan . |
| 6-21117 | 1/1994 | Japan . |
| 7-142488 | 6/1995 | Japan . |
| 7-193101 | 7/1995 | Japan . |
| 8-31870 | 2/1996 | Japan . |
| 9-181122 | 7/1997 | Japan . |
| 5-218137 | 8/1998 | Japan . |

OTHER PUBLICATIONS

Kazuhisa Tsunoi, et al., "Solderless Microbonding Technology Using Adhesive for Mobile PCs", ISHM '95 Proceedings, pp. 284–289.

*Primary Examiner*—Leo P. Picard
*Assistant Examiner*—Hung Van Duong

[57] ABSTRACT

In a face-down mount type of semiconductor device and a method of manufacturing the same, an external connection pad (6) of a circuit board (2) and a conductive bump (3) of a semiconductor chip (1) are coupled to each other, and thermoplastic resin (7) and curable resin (5) are filled into a gap (11) between the semiconductor chip (1) and the circuit board (2).

5 Claims, 4 Drawing Sheets

SEMICONDUCTOR DEVICE AND METHOD FOR MANUFACTURING THE SAME

BACKGROUND OF THE INVENTION

1. Field of the Invention

The present invention relates to a semiconductor device for use in electronic equipment, and a method for manufacturing the same, and more particularly to a semiconductor device which is improved in repair performance in a process for mounting a semiconductor chip on a circuit board based on a face-down system.

2. Description of the Related Art

In a face-down type semiconductor device as described above, as shown in FIG. 1, a projecting conductive bump 3 is formed at an external connection pad of a semiconductor chip 1, and a predetermined amount of liquefied thermosetting resin or liquefied photocurable or photosetting resin is coated at the center of a mount portion of the semiconductor chip of a circuit board 2. Thereafter, the conductive bump of the semiconductor chip 1 and an external connection pad 6 of the circuit board 2 are positioned to be positionally matched with each other. In the case of the thermosetting resin, the semiconductor chip is heated while the circuit board 3 is pressed to the semiconductor chip, and the thermosetting resin 5 is hardened, thereby coupling or joining the semiconductor chip 1 and the circuit board 2.

Further, in the case of the photocurable resin, after the semiconductor chip 1 and the circuit board 2 are positioned, the semiconductor chip 1 is pressed against the circuit board 2, and ultraviolet ray is irradiated to harden the photocurable resin, thereby coupling the semiconductor chip 1 and the circuit board 2.

Still further, Japanese Patent Application Laid-open No. Hei-5-6919 discloses a method (flip chip bonding method) for constructing this type of semiconductor device by using two types of resin. According to this method, a semiconductor chip is covered from the upper surface side of the semiconductor chip by an elastic member which is larger in size than the semiconductor chip, and the elastic member is fixed to a circuit board by thermoplastic resin to temporarily mount the semiconductor chip on the circuit board while the semiconductor chip is pressed and fixed onto the circuit board. Thereafter, photocurable resin is filled into the elastic member and sealed.

In a method of manufacturing a semiconductor device as shown in Japanese Patent Application Laid-open No. Hei-6-21117, a small amount of liquefied resin is transferred and supplied to the center of the chip by using a transfer method to temporarily fix the semiconductor chip to the circuit board by the resin, and then the same kind of liquefied resin is supplied to harden the resin and perfectly seal the semiconductor chip and the circuit board with the resin. In the case of this technique, the resin is filled into the gap between the circuit board or wiring board and the semiconductor chip and hardened.

In the semiconductor device as described above, the semiconductor chip and the circuit board are coupled to each other by using the hardening action of the sealing resin. In addition to the above type of semiconductor device, there is known another type of semiconductor device in which a conductive bump formed on a semiconductor chip and a connection pad of a circuit board are coupled to each other by solder, and then liquefied sealing resin is filled into the gap between the semiconductor chip and the circuit board and hardened. Such a type of semiconductor device is shown in FIG. 2 in which the conductive bump 3 of the semiconductor chip and the external connection pad 6 of the circuit board are connected to each other through solder 4.

A first problem of the above conventional technique is as follows. Since this type of semiconductor device uses thermosetting resin, repair cannot be performed when a semiconductor chip is recognized as a defective after the semiconductor chip and the circuit board are coupled to each other by hardening the resin.

In this type of semiconductor device, the semiconductor chip and the circuit board are adhesively attached to each other by hardening thermosetting resin or ultraviolet-ray curable resin, and electrically connected to each other as shown in FIGS. 1 and 2. Accordingly, even when the semiconductor chip is subsequently checked and judged as a defective, it is difficult to peel off the semiconductor chip together with the hardened thermosetting resin or the ultraviolet-ray curable resin without damaging the circuit board.

A second problem is as follows. According to the method disclosed in Japanese Patent Application Laid-open No. Hei-5-6919, the repair work can be performed after the semiconductor chip and the circuit board are temporarily fixed to each other. However, since the elastic member must be used in the semiconductor device so as to cover the semiconductor chip, it is impossible to design this type of semiconductor device in compact size and light weight, and high-density mounting is also impossible.

This is because the elastic member which is used for the temporary fixing is larger than the semiconductor chip and thus other parts cannot be mounted at the portion covered by the elastic member. Further, since the elastic member covers the semiconductor chip, the thickness of the elastic member increases the thickness of the semiconductor device.

A third problem is as follows. In the case of the method disclosed in Japanese Patent Application Laid-open No. Hei-6-21117, the resin is filled into the gap between the semiconductor chip and the circuit board and then hardened. This publication describes that a small amount of resin is first used to temporarily fix the semiconductor chip and the circuit board to each other and thus the semiconductor chip can be easily removed when the semiconductor chip is judged as a defective. However, this method uses curable (thermosetting or ultraviolet-ray curable) resin, and thus the repair work cannot be well performed.

The reason is as follows. Since the curable resin is used for the temporary fixing, the material of the curable resin is proximate to the material of the circuit board, and thus adhesion of the curable resin to the circuit board is good even when the amount of the resin is small. Therefore, when the semiconductor chip is removed from the circuit board, it is necessary to scrape the resin from the circuit board, so that the circuit board may be damaged.

A fourth problem is as follows. In this type of semiconductor device, the gap between the semiconductor chip and the circuit board is sealed by the resin. Particularly when the thermosetting resin is used, voids are formed in the sealing resin, and reliability of the semiconductor device is lowered.

The reason is as follows. Since the semiconductor chip is heated to a high temperature and the resin on the circuit board is rapidly heated and hardened by the heat of the semiconductor chip, residual solvent and monomers of low molecular weight in the resin are vaporized and remain in the hardened resin.

Further, in the case where the ultraviolet-ray curable resin is used, the process of heating the semiconductor chip to harden the resin is not needed. However, the ultraviolet ray is irradiated from the side surface to harden the resin while the semiconductor chip is pressed against the circuit board, and thus the ultraviolet ray is not sufficiently incident to the gap between the semiconductor chip and the circuit board because the gap is equal to several tens micrometers, so that hardening becomes insufficient. Accordingly, only a transparent glass substrate is usable as the circuit board. Therefore, this method is limited to a specific application, and it is unsuitable to general purposes.

A fifth problem is as follows. The external connection bump of the semiconductor chip which is electrically connected to the circuit board and the external connection pad of the circuit board are electrically connected while merely brought into contact with each other. Therefore, when a temperature cycle test is performed, it may be difficult to maintain the electrical connection between the semiconductor chip and the circuit board at a high temperature.

A sixth problem is as follows. The conductive bump of the semiconductor chip and the connection pad of the circuit board are connected to each other by only the solder. Therefore, when the sealing resin is filled into the gap between the semiconductor chip and the circuit board, cracks may occur in the solder during the resin sealing process and the resin hardening process. As described above, the conductive bump of the semiconductor chip and the connection pad of the circuit board are coupled by only the solder. In this case, the semiconductor chip is heated to about 250° C. to melt the solder formed on the connection pad of the circuit board, thereby coupling the semiconductor chip and the circuit board. In this case, however, in the cooling progress of the chip, cracks occur in the coupling portion of the solder by stresses due to the difference in thermal expansion coefficient between the circuit board and the semiconductor chip and by impacts due to handling during the period from the mount step to the resin sealing step.

SUMMARY OF THE INVENTION

An object of the present invention is to improve the problems of the prior art as described above, and to provide a face-down type semiconductor device in which repair can be easily performed when it is identified as a defective after a semiconductor chip is mounted on a circuit a board and then subjected to a check test, and also no void occurs in sealing resin.

Further, in order to enhance reliability to connection, another object of the present invention is to provide a semiconductor device having high reliability in which a conductive bump of a semiconductor chip and an external connection pad of a circuit board are coupled to each other by solder.

In order to attain the above objects, according to a first aspect of the present invention, there is provided a face-down mount type of semiconductor device in which an external connection pad of a circuit board and a conductive bump of a semiconductor chip are coupled to each other, wherein thermoplastic resin and curable resin are filled in a gap between the semiconductor chip and the circuit board.

In the face-down mount type of semiconductor device, the thermoplastic resin to adhesively connect the semiconductor chip and the circuit board to each other are preferably filled in the neighborhood of the center portion of the gap between the semiconductor chip and the circuit board, and the curable resin to adhesively connect the semiconductor chip and the circuit board to each other is filled around the thermoplastic resin.

The conductive bump of the semiconductor chip and the external connection pad of the circuit board can be connected to each other through solder. In this case, glass transition point of the thermoplastic resin is preferably higher than melting point of the solder.

In order to attain the above objects, according to a second aspect of the present invention, there is provided a method for manufacturing a face-down mount type of semiconductor device, comprising:

a step of putting on a circuit board a thermoplastic resin member whose amount is set so as to cover a desired area of a substantially central portion of a semiconductor chip;

a step of positioning a conductive bump of the semiconductor chip and a connection pad of the circuit board so that the conductive bump and the connection pad are positionally coincident with each other;

a step of heating the semiconductor chip to melt the thermoplastic resin member and pressing the semiconductor chip to the circuit board to electrically connect the circuit board and the semiconductor chip to each other; and a step of filling curable resin into a space having no thermoplastic resin filled therein in a gap between the circuit board and the semiconductor chip and supplying energy to the curable resin to cure the curable resin.

In order to attain the above objects, according to a third aspect of the present invention, there is provided a method for manufacturing a face-down mount type of semiconductor device, comprising:

a step of putting on a circuit board a thermoplastic resin member whose amount is set so as to cover a desired area of a substantially central portion of a semiconductor chip;

a step of positioning a conductive bump of the semiconductor chip and a connection pad of the circuit board which is coated with solder so that the conductive bump and the connection pad are positionally coincident with each other;

a step of heating the semiconductor chip to melt the thermoplastic resin member and the solder coated on the connection pad and pressing the semiconductor chip to the circuit board to electrically connect the circuit board and the semiconductor chip to each other through the solder; and a step of filling curable resin into a space having no thermoplastic resin filled therein in a gap between the circuit board and the semiconductor chip and supplying energy to the curable resin to cure the curable resin.

In this method for manufacturing a face-down mount type of semiconductor device, glass transition point of the thermoplastic resin is preferably higher than melting point of the solder.

The semiconductor device and the semiconductor device manufacturing method of the present invention utilize the above technical feature. In the conventional face-down type semiconductor device, the semiconductor chip and the circuit board are adhesively attached to each other and electrically coupled to each other by hardening the resin which is put between the semiconductor chip and the circuit board. Accordingly, since the curable resin is used, it is difficult to remove the semiconductor chip when the semiconductor chip is afterwards judged as a defective. However, according to the semiconductor device and the semiconductor device manufacturing method of the present invention, thermoplastic resin is used as temporarily fixing resin, and it is melted to temporarily couple the semiconductor chip and the circuit board to each other. When the semiconductor chip is judged as a defective in a subsequent check test, the semiconductor chip is heated to a temperature which is higher than the melting point or more of the thermoplastic resin to thereby easily remove the defective semiconductor chip from the circuit board.

Further, in the conventional semiconductor device, the curable resin is quickly heated and voids occur in the sealing resin, so that the reliability of the semiconductor device is lowered. However, in the semiconductor device of the present invention, the thermoplastic resin is located at the central portion of the semiconductor chip, and thus no void occurs and resin sealing can be performed with high reliability.

Still further, in the semiconductor device in which the semiconductor chip and the circuit board are connected to each other by the solder, the thermoplastic resin is located at the center of the semiconductor chip in the soldering process to temporarily fix the semiconductor device and the circuit board. Therefore, the impact at the handling and the stress due to the difference in thermal expansion coefficient between the semiconductor chip and the circuit board can be moderated.

DETAILED DESCRIPTION OF THE PREFERRED EMBODIMENTS

Preferred embodiments according to the present invention will be described hereunder with reference to the accompanying drawings. The specific construction of the semiconductor device and the semiconductor device manufacturing method according to the present invention will be described in detail.

Figure 3:
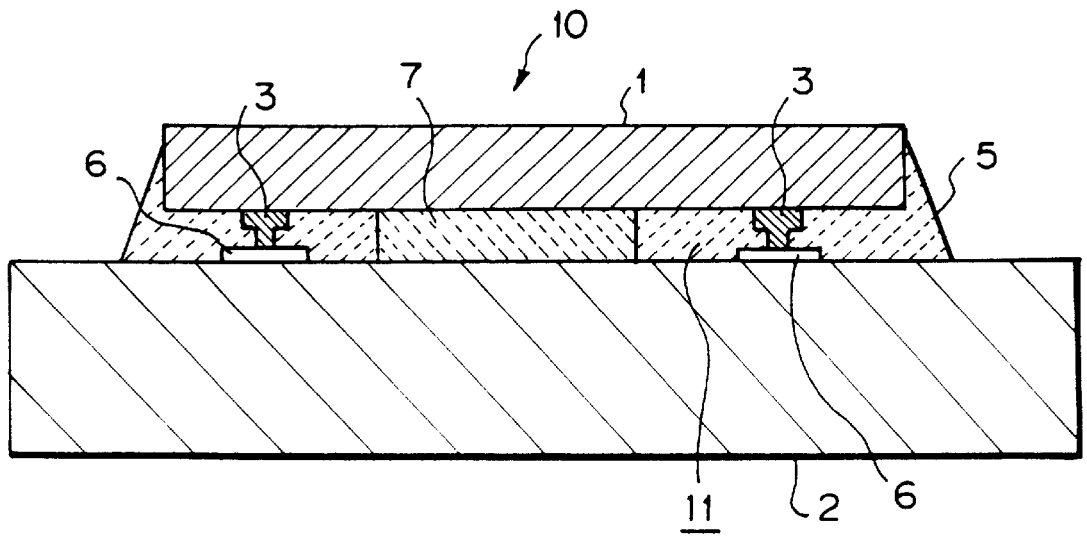
FIG. 3 is a cross-sectional view showing the construction of a first embodiment of a semiconductor device according to the present invention.

FIG. 3 is a cross-sectional view showing the construction of the semiconductor device according to the present invention, and shows a face-down type of semiconductor device 10 in which an external connection pad 6 of a circuit board 2 and a conductive bump 3 of a semiconductor chip 1 are coupled to each other in which thermoplastic resin 7 and curable resin 5 such as thermosetting resin or photosetting resin are filled into a gap 11 between the semiconductor chip 1 and the circuit board 2.

That is, in the semiconductor device 10 according to the present invention, the conductive bump 3 of the semiconductor chip 1 and the connection pad 6 of the circuit board 2 are arranged in the above structure, and they are kept to be connected in contact with each other by adhesion force of the thermoplastic resin 7 and the curable resin 5.

In the face-down type semiconductor device of the present invention, it is preferable that the thermoplastic resin 7 is located substantially at the center of the surface of the semiconductor chip 1 and the peripheral portion of the semiconductor chip 1 is sealed by the curable resin 5 when the semiconductor chip 1 and the circuit board 2 are adhesively attached to each other.

Accordingly, as a preferable mode of the semiconductor device 10 according to the present invention, the thermoplastic resin 7 which is used to adhesively join the semiconductor chip 1 and the circuit board 2 is filled in the neighborhood of the center portion of the gap 11 between the semiconductor chip 1 and the circuit board 2, and the curable resin 5 for adhesively joining the semiconductor chip 1 and the circuit board 2 to each other is filled and disposed around the thermoplastic resin 7.

As shown in FIG. 3, an electrically conductive bump 3 is formed at a height of 20 to 80 μm on the semiconductor chip 1, and the conductive bump 3 of the semiconductor chip is electrically connected to the connection pad 6 of the circuit board 2 while brought into contact with the connection pad 6. The thermoplastic resin 7 is adhesively filled into the substantially center portion of the gap 11 between the semiconductor chip 1 and the circuit board 2 so as to cover an area of 20% to 80% of the total area of the semiconductor chip 1, and the peripheral portion thereof is sealed by the curable resin 5 such as photocurable or thermosetting resin to form the semiconductor device 10.

Figure 1:
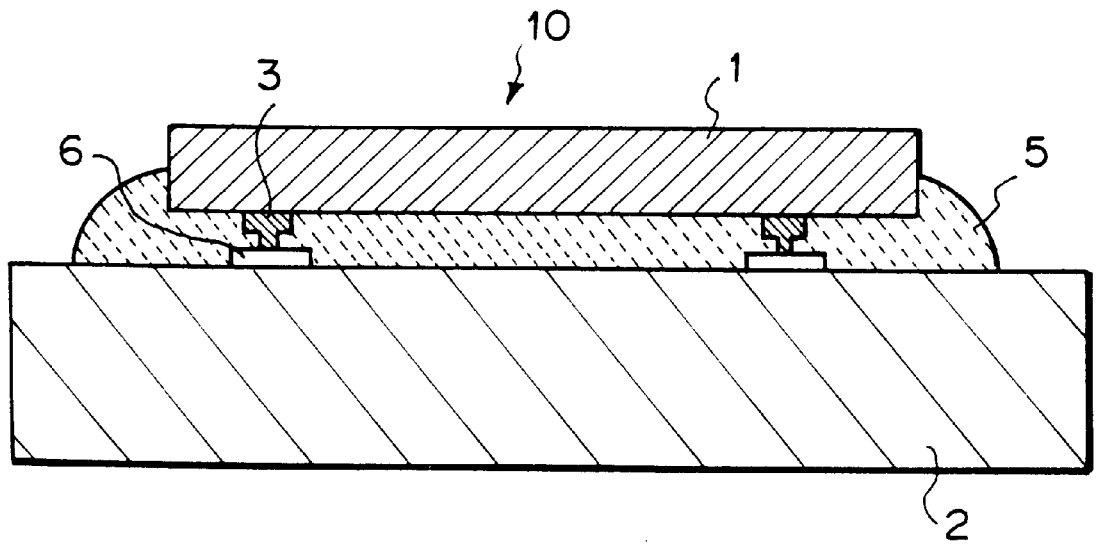
FIG. 1 is a cross-sectional view showing the construction of a conventional semiconductor device.
Figure 2:
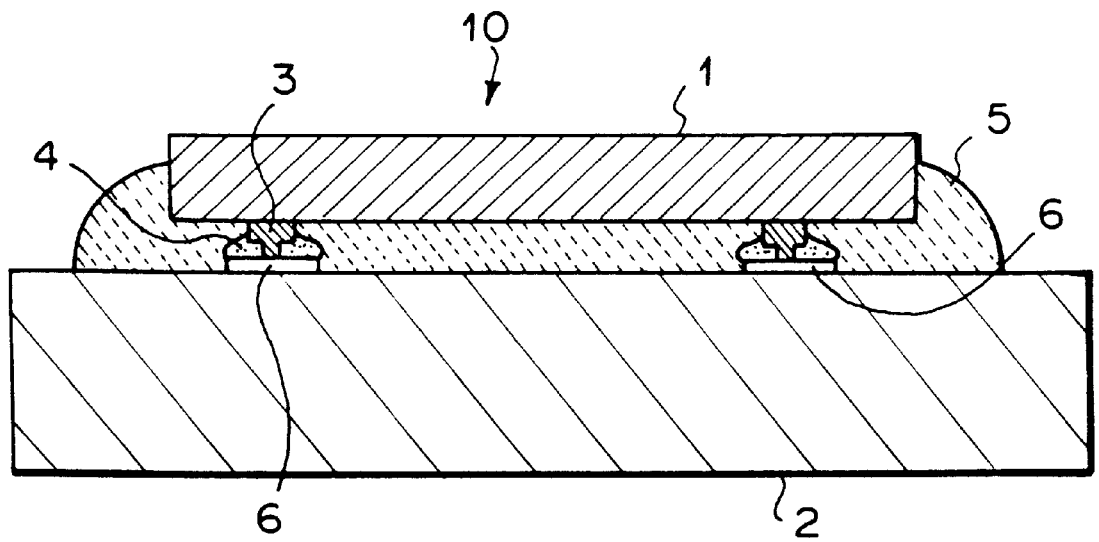
FIG. 2 is a cross-sectional view showing the construction of another conventional semiconductor device.

Further, in another embodiment of the semiconductor device 10 of the present invention, as shown in FIG. 2, solder 4 is beforehand supplied on the external connection pad 6 of the circuit board 2 to couple the conductive bump S of the semiconductor chip 1 and the external connection pad 6 of the circuit board 2 through the solder 4.

In this embodiment of the semiconductor device 10 of the present invention, it is preferable that the glass transition point of the thermoplastic resin 7 which is located substantially at the center of the semiconductor chip 1 is set to be higher than the melting point of the solder 4.

Figure 4:
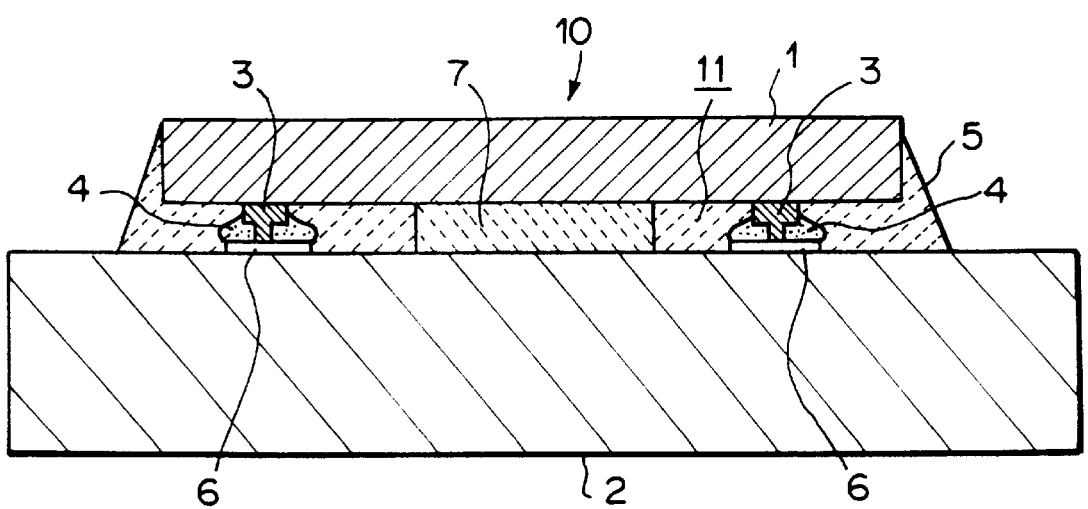
FIG. 4 is a cross-sectional view showing the construction of a second embodiment of the semiconductor device according to the present invention.

As shown in FIG. 4, an electrically conductive bump 3 is formed at a height of 20 to 80 μm on the semiconductor chip 1 and further solder 4 is applied at a thickness of 10 to 30 μm on the connection pad 6 of the circuit board 2. The conductive bump 3 of the semiconductor chip 1 is electrically connected to the connection pad 6 of the circuit board 2 through the solder 4, and the thermoplastic resin 7 is adhesively filled at the center of the gap 11 between the semiconductor chip 1 and the circuit board 2 so as to cover an area ranging from 20% to 80% of the total area of the semiconductor chip 1, and the peripheral portion thereof is sealed by the curable resin 5 such as photocurable or thermosetting resin to form the semiconductor device 10.

Next, a method of manufacturing the semiconductor device according to the present invention will be described.

The method for manufacturing such a semiconductor device as shown in FIG. 3, wherein the semiconductor chip 1 is mounted on the circuit board 2 by a face-down method, comprises a step of putting at the substantially central portion of a circuit board 2 a thermoplastic resin member 7 whose amount is set so as to cover a desired area of a substantially central portion of a semiconductor chip 1, a step of positioning a conductive bump 3 of the semiconductor chip 1 and a connection pad 6 of the circuit board 2 so that the conductive bump and the connection pad are positionally coincident with each other, a step of heating the semiconductor chip 1 to melt the thermoplastic resin member 7 and pressing the semiconductor chip 1 to the circuit board 2 to electrically connect the circuit board 2 and the semiconductor chip 1 to each other, and a step of filling curable resin 5 into a space having no thermoplastic resin filled therein in the gap 11 between the circuit board 2 and the semiconductor chip 1 and supplying suitable energy to the curable resin 5 to cure the curable resin 5.

Further, in the semiconductor device manufacturing method according to the present invention, when the semiconductor chip 1 is mounted on the circuit board 2 having the connection pad 6 coated with the solder 4 by the face-down method, that is, when manufacturing such a semiconductor device as shown in FIG. 4, the semiconductor device manufacturing method may comprise a step of putting at the substantially central portion of the circuit board 2 a thermoplastic resin 7 whose amount is set so as to cover a desired area at the substantially central portion of the semiconductor chip 1, a step of positioning the conductive bump 3 of the semiconductor chip 1 and the connection pad 6 of the circuit board 2 which is coated with the solder 4 so that the conductive bump 3 and the connection pad 6 are positionally coincident with each other, a step of heating the semiconductor chip 1 to melt the thermoplastic resin member 7 and the solder 4 coated on the connection pad 6 and pressing the semiconductor chip 1 so that the circuit board 2 and the semiconductor chip 1 are electrically connected to each other through the solder 4, and a step of filling the curable resin 5 into a space having no thermoplastic resin 7 filled therein in the gap 11 between the circuit board 2 and the semiconductor chip 1 and supplying suitable energy to the curable resin 5 to harden the curable resin 5.

In the present invention, any resin may be used as the curable resin insofar as it is normally liquid and it is curable when it is supplied with suitable energy such as thermal energy, light energy or the like.

Further, in the present invention, as the thermoplastic resin is preferably used resin which has a melting point below 300° C. or less or has a glass transition point of 230° C. or less.

Any shape may be used as the shape of the thermoplastic resin member 7 insofar as a predetermined amount of the resin can be located at a predetermined position, for example, it may be shaped in the form of film, drop of liquid, sphere, particle or the like.

Next, the method of manufacturing the semiconductor device 10 according to the first embodiment of the present invention shown in FIG. 3 will be described in the order of steps with reference to FIGS. 5A to 5D.

In FIGS. 5A to 5D, the conductive bump 3 is formed on the semiconductor chip 1, and the thermoplastic resin film 7 is put at the substantially central portion of the semiconductor chip mount portion of the circuit board 2. At this time, the thickness of the thermoplastic resin film 7 is set to be equal to or larger than the height of the conductive bump 3 which is formed on the semiconductor chip 1.

The positioning of the conductive bump 3 of the semiconductor chip 1 and the external connection pad 6 of the circuit board 2 is performed.

Figure 5A:
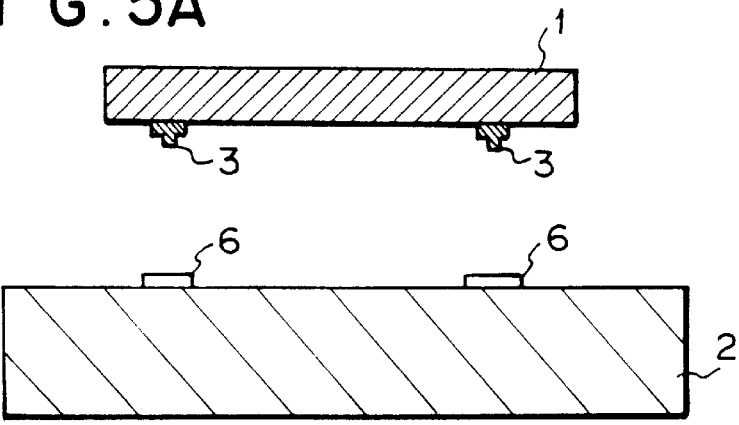
FIGS. 5A to 5D are cross-sectional views showing a semiconductor device to explain a manufacturing method of the first, embodiment of the present invention in a step order.
Figure 5B:
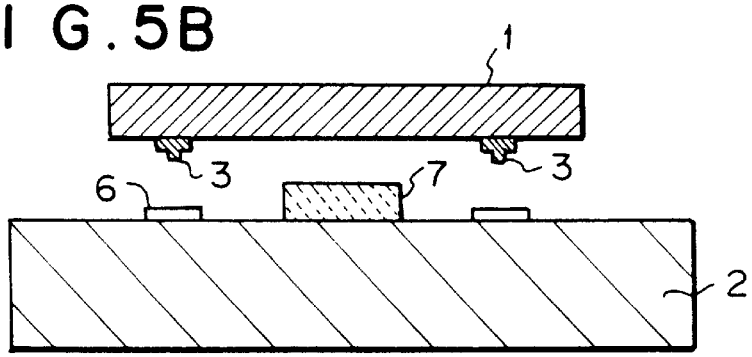
Figure 5C:
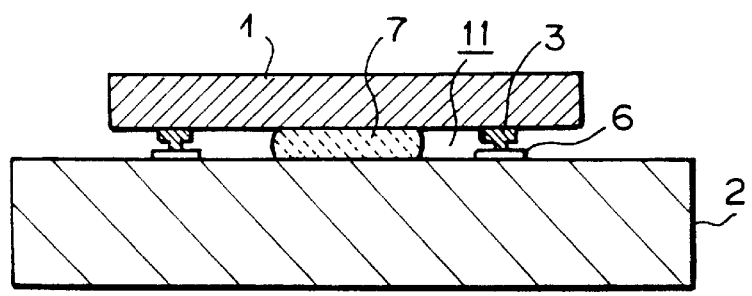
Figure 5D:
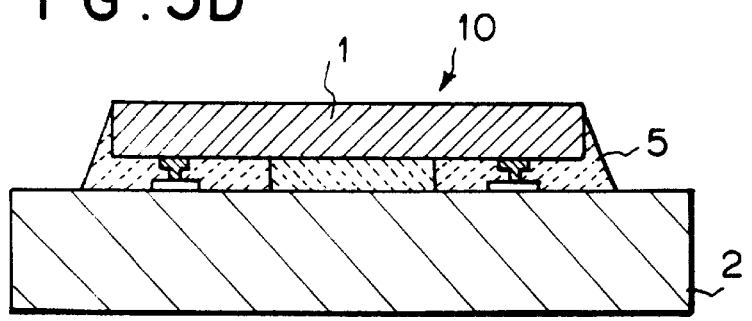

As shown in FIG. 5C, after the positioning, the semiconductor chip 1 is heated to a temperature higher than the melting point of the thermoplastic resin film 7, and the semiconductor chip 1 is pressed against the circuit board 2, whereby the thermoplastic resin film 7 is heated and melted. Thereafter, the thermoplastic resin 7 is cooled until it is solidified while the semiconductor chip is pressed. In this step, the semiconductor chip 1 and the circuit board 2 are adhesively attached to each other by the thermoplastic resin 7, and the conductive bump 3 and the external connection pad 6 of the circuit board 2 are electrically coupled to each other while pressed against each other.

Thereafter, the semiconductor device 10 thus formed is subjected to the check test in the above state. If the semiconductor device 10 is judged as one having a defective semiconductor chip 1, the semiconductor chip 1 is heated to a temperature higher than the melting point of the thermoplastic resin 7 to remove the defective semiconductor chip, and then the thermoplastic resin attached onto the circuit board 2 is removed while heated.

The above operation is repeated. If the semiconductor device 10 is judged as a good product through the check test in the state of FIG. 5C, for example, the liquefied thermosetting resin 5 is filled into an area having no thermoplastic resin in the space which is formed by the semiconductor chip 1 and the circuit board 2 as shown in FIG. 6D, and then the thermosetting resin 5 is cured.

The manufacturing method of the first embodiment according to the present invention will be described in more detail.

Referring to FIG. 5A, the conductive bump 3 on the semiconductor chip 1 is formed to have a bump diameter 60 to 100 $\mu$m and a bump height of 40 to 65 $\mu$m by the gold ball bump method. A solder bump based on the plating method may be used as the conductive bump.

Subsequently, referring to FIG. 5B, the thermoplastic resin film 7 is put on the substantially central portion of the circuit board 2 on which the semiconductor chip 1 is mounted. A polyether amide film is used as the thermoplastic resin film 7. When the size of the semiconductor chip 1 is equal to 10 mm in square, the polyether amide film is cut out at a size of 3 to 5 mm in square. The film thickness of the polyether amide film is set to be larger than the height of the conductive bump by 5 $\mu$m.

Accordingly, when the bump is formed by the gold ball bump method, the film thickness of the polyether amide film is set to 45 to 70 $\mu$m. Subsequently, the gold ball bump 3 of the semiconductor chip 1 and the external connection pad 6 of the circuit board 2 are positioned to be positionally coincident with each other, and then the semiconductor chip is heated to 280° C. and pressed against the circuit board 2 from the upper side of the polyether amide film to melt the polyether amide film to temporarily fit the semiconductor chip 1 and the circuit board 2 to each other.

Thereafter, the press is stopped when the chip temperature is reduced to 200° C. or less. The press force at this time is set to 30 g/bump. The check test is performed on the semiconductor device thus formed, and if the semiconductor chip is judged as a defective one, it is heated to 240 to 300° and removed. If it is judged as a good semiconductor chip through the check test, liquid epoxy resin is filled from the periphery of filled from the periphery of the semiconductor chip into a space where no polyether amide resin is filled, by using a dispenser. After a defoaming process is performed under vacuum, the result is treated at 100° C. for 2 hours and 150° C. for 2 hours to harden the epoxy resin.

Figure 6A:
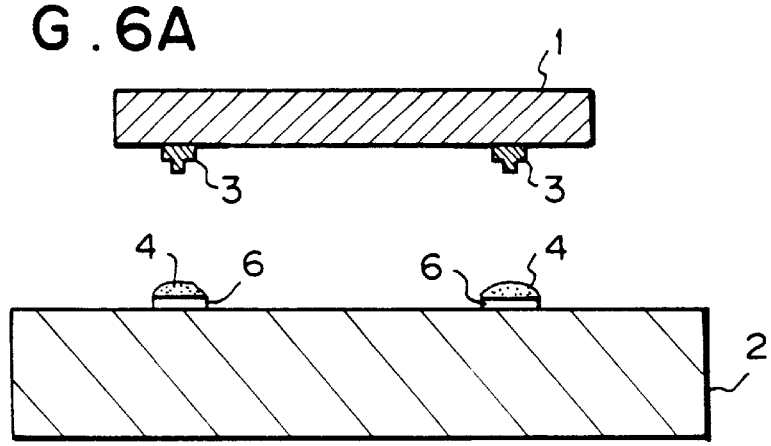
FIGS. 6A to 6D are cross-sectional view showing the semiconductor device to explain a manufacturing method of the second embodiment of the present invention in a step order.
Figure 6B:
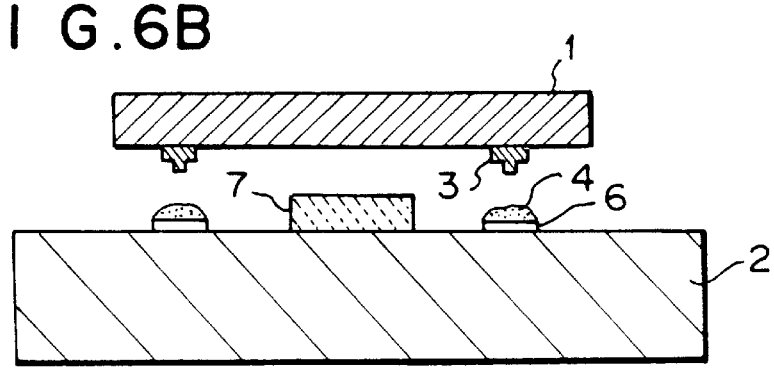
Figure 6C:
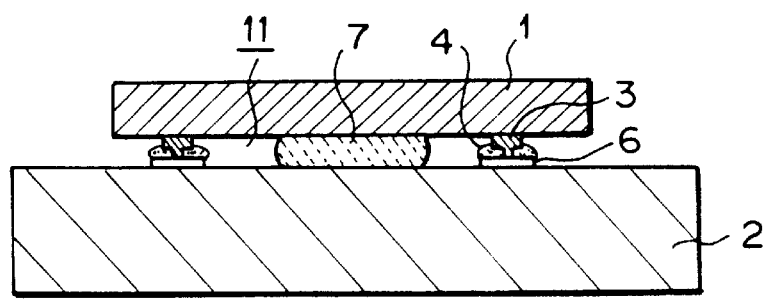
Figure 6D:
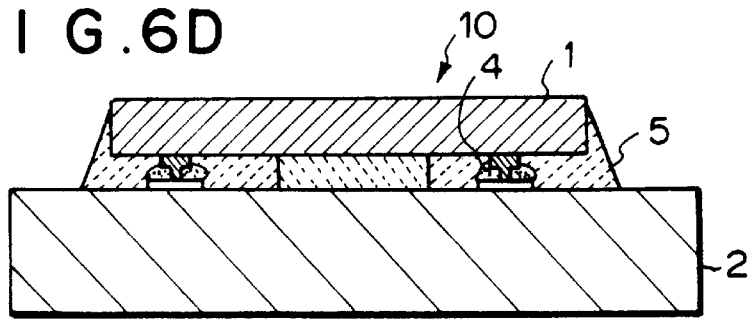

Next, the method of manufacturing the semiconductor device 10 according to the second embodiment of the present invention shown in FIG. 4 will be described in the order of steps with reference to FIGS. 6A to 6D In this manufacturing method, in order to stabilize the electrical coupling of the conductive bump 3 formed on the semiconductor chip 1 and the external connection pad 6 of the circuit board 2, the solder 4 is supplied onto the external connection pad 6 of the circuit board 2 as shown in FIGS. 6A to 6D. When the semiconductor chip 1 is heated and pressed against the circuit board 2 as shown in FIG. 6C, the heating temperature of the semiconductor chip 1 is set to be higher than the melting temperature of the thermoplastic resin film 7. Further, in this case, the heating temperature of the semiconductor chip 1 is also set to be higher than the melting point of the solder 4 on the external connection pad 6 of the circuit board 2, so that both the thermoplastic resin and the solder are melted to perform the coupling operation.

The manufacturing method of the second embodiment according to the present invention will be described in more detail.

Referring to FIG. 6A, the conductive bump 3 on the semiconductor chip 1 is formed to have a bump diameter 60 to 100 μm and a bump height of 40 to 65 μm by the gold ball bump method. A solder bump based on the plating method may be used as the conductive bump.

Subsequently, referring to FIG. 6B, the thermoplastic resin film 7 is put on the substantially central portion of the circuit board 2 on which the semiconductor chip 1 is mounted. A polyether amide film is used as the thermoplastic resin film 7. When the size of the semiconductor chip 1 is equal to 10 mm in square, the polyether amide film is cut out at a size of 3 to 5 mm in square. The film thickness of the polyether amide film is set to be larger than the height of the conductive bump by 5 μm.

Accordingly, when the bump is formed by the gold ball bump method, the film thickness of the polyether amide film is set to 45 to 70 μm. Further, tin-silver solder is applied to the connection pad 6 of the circuit board 3 at a thickness of 10 to 30 μm. Subsequently, the gold ball bump 3 of the semiconductor chip 1 and the external connection pad 6 of the circuit board 2 are positioned to be positionally coincident with each other, and then the semiconductor chip is heated to 240 to 300° C. and pressed against the circuit board 2 from the upper side of the polyether amide film to melt the polyether amide film. The polyether amide film 7 is melted, the sold ball bump 3 is brought into contact with the solder 4 on the connection pad 6 of the circuit board 2, and the tin-silver solder 4 is melted to temporarily fit the semiconductor chip 1 and the circuit board 2 to each other.

Thereafter, the press is stopped when the chip temperature is reduced to 200° C. or less. The press force at this time is set to 10 to 50 g/bump. The check test is performed on the semiconductor device thus formed, and if the semiconductor chip is judged as a defective one, it is heated to 240 to 300° C. and removed. If it is judged as a good semiconductor chip through the check test, liquid epoxy resin is filled from the periphery of the semiconductor chip into a space where no polyether amide resin is filled, by using a dispenser. After the vacuum-defoaming process, the result is treated at 100° C. for 2 hours and 150° C. for 2 hours to harden the epoxy resin.

The semiconductor device and the semiconductor device manufacturing method according to the present invention adopt the above-described technical construction, and thus they have the following effects.

As a first effect, the semiconductor chip is temporarily fitted to the circuit board by the thermoplastic resin, and thus at this time the check test can be performed on the semiconductor device. Therefore, if the semiconductor device is judged as one having a defective semiconductor chip, the chip can be easily removed. This is because the semiconductor chip and the circuit board are temporarily fitted to each other, however, the thermoplastic resin is easily melted by re-heating so that the semiconductor chip is removed.

As a second effect, the thermoplastic resin is provided at the center of the semiconductor chip for adhesion. Therefore, no void occurs in the resin with which the semiconductor chip is sealingly connected to the circuit board at the center of the semiconductor chip, so that reliability of the semiconductor device is enhanced. This is because there is no solvent or monomers of low molecular weight based on the curable resin such as epoxy resin at the area corresponding to the center of the semiconductor chip.

As a third effect, when the conductive bump of the semiconductor chip and the connection pad of the circuit board are connected to each other by the solder, no crack occurs in the solder and thus the connection can be performed with high reliability. This is because when the conductive bump of the semiconductor chip and the connection pad of the circuit board are connected to each other by the solder, the semiconductor chip and the circuit board are also adhesively attached to each other by the thermoplastic resin at the same time, so that the stress can be moderated and the connection reliability can be enhanced.

What is claimed is:

1. A face-down mount type of semiconductor device in which an external connection pad of a circuit board and a conductive bump of a semiconductor chip are coupled to each other, characterized in that thermoplastic resin and curable resin are filled in a gap between said semiconductor chip and said circuit board, said conductive bump of said semiconductor chip and said external connection pad of said circuit board are connected to each other through solder, wherein the glass transition point of said thermoplastic resin is higher than the melting point of said solder.

2. The face-down mount type of semiconductor device as claimed in claim 1, wherein said thermoplastic resin to adhesively connect said semiconductor chip and said circuit board to each other is filled in the neighborhood of a center portion of a gap between said semiconductor chip and said circuit board, and said curable resin to adhesively connect said semiconductor chip and said circuit board to each other is filled around said thermoplastic resin.

3. A face down mount type of semiconductor device in which an external connection pad of a circuit board and a conductive bump of a semiconductor chip are coupled to each other, a thermoplastic resin and a curable resin are filled in a gap between said semiconductor chip and said circuit board, said thermoplastic resin covers an area of 20% to 80% of the total area of the semiconductor chip, said conductive bump of said semiconductor chip and said external connection pad of said circuit board are connected to each other through solder, wherein the glass transition point of said thermoplastic resin is higher than the melting point of said solder.

4. The face-down mount type of semiconductor device as claimed in claim 3, wherein said thermoplastic resin to adhesively connect semiconductor chip and said circuit board to each other is filled in the area of a center portion of a gap between said semiconductor chip and said circuit board, and said curable resin to adhesively connect said semiconductor chip and said circuit board to each other and is filled around said thermoplastic resin.

5. The face-down mount type of semiconductor device as claimed in claim 4, wherein said curable resin to adhesively connect said semiconductor chip and said circuit board to each other is filled in the gap between said semiconductor chip and said circuit board so as to surround the external connection pad and the conductive bump.

* * * * *